United States Patent
Shinke et al.

(10) Patent No.: US 6,437,489 B1
(45) Date of Patent: Aug. 20, 2002

(54) ACTUATOR UTILIZING PIEZOELECTRIC TRANSDUCER

(75) Inventors: Satoshi Shinke, Sakai; Hiroji Katsuragi, Izumi, both of (JP)

(73) Assignee: Minolta Co., Ltd., Osaka (JP)

( * ) Notice: Subject to any disclaimer, the term of this patent is extended or adjusted under 35 U.S.C. 154(b) by 0 days.

(21) Appl. No.: 09/705,333

(22) Filed: Nov. 3, 2000

(30) Foreign Application Priority Data

Nov. 8, 1999  (JP) .......................................... 11-316830

(51) Int. Cl.⁷ ............................................... H01L 41/22
(52) U.S. Cl. ......................... 310/369; 310/367; 310/800
(58) Field of Search ................................ 310/800, 367, 310/4.5, 369, 366, 365; H01L 41/22, 41/083

(56) References Cited

U.S. PATENT DOCUMENTS

| 3,781,955 A | * | 1/1974 | Lavrineko | 310/8.5 |
| 4,330,730 A | * | 5/1982 | Kurz | 310/800 |
| 5,559,387 A | * | 9/1996 | Beurrier | 310/367 |

FOREIGN PATENT DOCUMENTS

| JP | 11-112046 A1 | * | 9/1997 | .......... H01L/41/22 |
| JP | 11-195819 A1 | * | 12/1997 | .......... H01L/41/22 |
| JP | 11-112046 A | | 4/1999 | |
| JP | 11-195819 A | | 7/1999 | |
| JP | 11-266039 A | | 9/1999 | |
| JP | 11-266939 | * | 9/1999 | .......... H01L/41/083 |

* cited by examiner

*Primary Examiner*—Nestor Ramirez
*Assistant Examiner*—Karen Addison
(74) *Attorney, Agent, or Firm*—Sidley Austin Brown & Wood LLP

(57) ABSTRACT

There is provided an actuator utilizing a piezoelectric transducer that is structured in small size by feeding the electrical power to the internal surface to the piezoelectric transducer formed in the cylindrical shape. The electrodes are formed to both front and rear surfaces of a sheet type piezoelectric element and this element is wound in the cylindrical shape. The cylindrical material is normalized under the predetermined temperature and a voltage is applied across the electrodes for the polarization purpose. An electrode terminal having the contactors is inserted to the internal surface of the piezoelectric transducer formed in the cylindrical shape and the contactors are placed in contact with the electrodes exposed at the internal surface of the cylindrical shape for the purpose of power feeding.

9 Claims, 12 Drawing Sheets

ACTUATOR UTILIZING PIEZOELECTRIC TRANSDUCER

This application is based on the patent application No. 11-316830 filed in Japan, the contents of which are hereby incorporated by reference.

BACKGROUND OF THE INVENTION

1. Field of the Invention

The present invention relates to an actuator utilizing a piezoelectric transducer that is formed in a cylindrical shape by coiling sheet type piezoelectric elements.

2. Prior Art

An actuator utilizing a piezoelectric transducer assures high conversion efficiency for converting electric energy supplied to a drive force, large drive force to be generated although small size and light weight and easier control of drive force. Therefore, this actuator has been used for drive and positioning of the members to be driven of a camera, a measuring instrument and the other high precision apparatuses.

A piezoelectric transducer formed as a drive source to be used in such actuator is formed, for example, by laminating a plurality of sheets of unit piezoelectric element because it is requested to obtain a large displacement as possible in the thickness direction generated in a unit piezoelectric element.

A piezoelectric transducer formed by laminating a plurality of sheets of the unit piezoelectric element has been obtained at a higher cost because it is manufactured through complicated processes including the process to provide an electrode on the surface of unit element, the process to laminate and bond the sheets of piezoelectric element and the process to connect the electrode of each layer.

Therefore, there is proposed a piezoelectric transducer that has been formed by winding, in the hollow cylindrical form, a laminated material that has been formed by laminating two sheets of thin plate type piezoelectric elements having formed an electrode as its surface.

FIG. 16 is a perspective view illustrating an example of a piezoelectric transducer that is formed in the cylindrical shape by laminating such two sheets of thin plate type piezoelectric elements. FIGS. 17(a) and 17(b) are diagrams for explaining the electrode forming surface and laminating condition. FIG. 18 is a plan view for explaining the condition of the end surface in the cylinder axis direction of the piezoelectric transducer formed cylindrically.

The manufacturing process of a piezoelectric transducer will be explained. First, as illustrated in FIG. 17(a), a first piezoelectric element 101 and a second piezoelectric element 102 formed of piezoelectric ceramics formed like thin plates are prepared. Here, the length in the winding direction of the second piezoelectric element 102 is set longer by the sized than the first piezoelectric element 101.

At the front surface of the first piezoelectric element 101, a first electrode 103 is formed while the rear surface is formed as an electrode non-forming surface. Moreover, at the front surface of the second piezoelectric element 102, a second electrode 104 is formed, while the rear surface is formed as the electrode non-forming surface (refer to FIG. 17(a)) Next, as illustrated in FIG. 17(b), the electrode non-forming surface of the first piezoelectric element 101 and the electrode forming surface of the second piezoelectric element 102 are laminated with these surfaces provided opposed with each other and this laminated material is then wound into a cylindrical shape as illustrated in FIG. 16 using a winding shaft for the working use formed of cellulose or the like. Thereafter, this cylindrical shape is baked in the predetermined temperature and then polarized, thereby burning and completing the piezoelectric transducer. Since the winding shaft for the working use is burned out with the baking process, a cylindrical space is left at the innermost part of the cylindrical material.

Since the length of the first piezoelectric element 101 in the winding direction is set shorter than the length of the second piezoelectric element 102 in the winding direction, when the cylindrical shape is formed, the end portions of first electrode 103 and the second electrode 104 exposed at the external circumference of the cylindrical shape are deviated and thereby these electrodes may be connected easily with the lead wires 103a and 104a.

In the cylindrical piezoelectric transducer of the structure explained above, since the length of the first piezoelectric element 101 in the winding direction is set shorter than the length of the second piezoelectric element 102 in the winding direction, the end portions of the first electrode 103 and second electrode 104 are deviated when the cylindrical shape is formed. Therefore, these electrodes can easily be connected with the lead wires. But, Since the lead wire is extended from the external circumference part of the piezoelectric transducer, there rise disadvantages that the external size of the piezoelectric transducer as a whole becomes large and as a result, a wider space is required. The present invention has an object to solve such disadvantages.

SUMMARY OF THE INVENTION

The principal object of the present invention is to provide an actuator utilizing a piezoelectric transducer of a novel structure that is designed in small size as the entire part by introducing a newly applied power feeding terminals.

It is another object of the present invention to provide an actuator utilizing a piezoelectric transducer that is fed from the electrode exposed at the internal surface of cylindrical shape of the cylindrical piezoelectric transducer.

It is still another object of the present invention to provide an actuator utilizing a piezoelectric transducer of a novel structure wherein a sheet type piezoelectric element arranging the electrodes at both surfaces thereof is formed in the cylindrical shape and the power feeding terminals are placed in contact with the electrodes exposed as the internal surface of the cylindrical shape.

Other objects of the present invention will become apparent from detail explanation of the present invention with reference to the accompanying drawings.

DESCRIPTION OF THE PREFERRED EMBODIMENTS

The preferred embodiments of the present invention will then be explained in detail.

[First Embodiment]

A piezoelectric transducer of the first embodiment is formed in the cylindrical shape by forming respectively the electrode bodies (hereinafter, referred only to as electrode) at both front and rear surfaces of a sheet of piezoelectric element composed of a piezoelectric ceramic-based piezoelectric material and then winding such piezoelectric element sheet into the cylindrical body.

Figure 1:
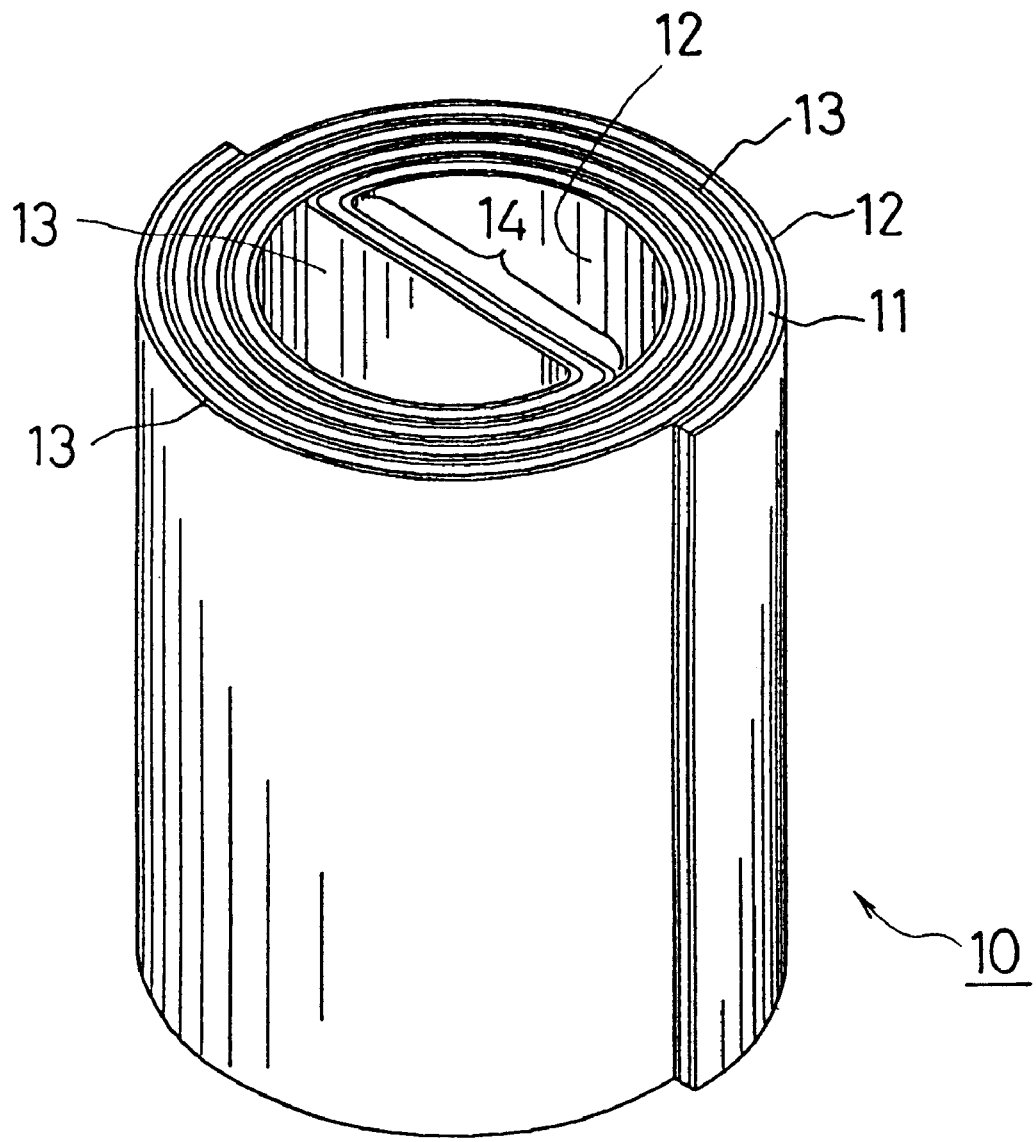
FIG. 1 is a perspective view illustrating the external appearance of a piezoelectric transducer of the first embodiment.
Figure 2:
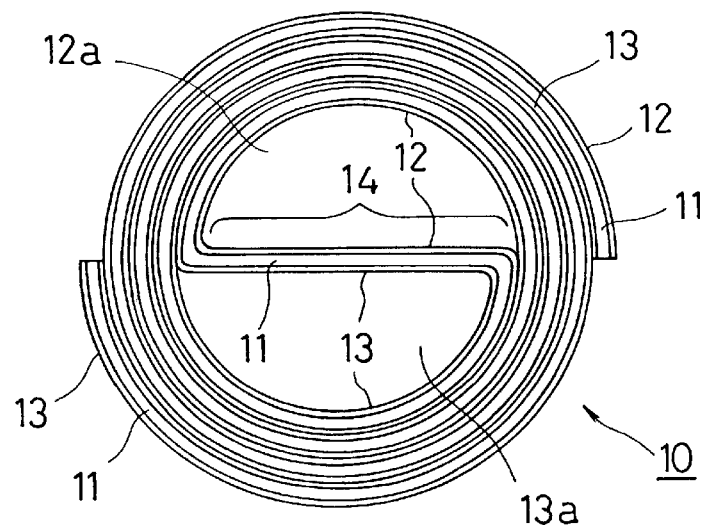
FIG. 2 is a cross-sectional view illustrating a structure of a piezoelectric transducer of the first embodiment.

FIG. 1 is a perspective view illustrating a structure of the piezoelectric transducer of the first embodiment, while FIG. 2 is a cross-sectional view of the same piezoelectric transducer. For the purpose of explanation, thickness of the piezoelectric element and electrode is illustrated as the expanded views. In the case of this piezoelectric transducer 10, a sheet type piezoelectric element 11 is formed first using a piezoelectric ceramic-based piezoelectric material, and a first electrode 12 and a second electrode 13 are formed respectively to the front surface and rear surface of such sheet type piezoelectric element 11. Next, this element 11 is then wound with the center area defined as the coupling part 14 leaving the constant width and is then formed into the cylindrical shape in such a manner that the piezoelectric element is laminated with each other.

Next, the manufacturing process of the piezoelectric transducer 10 will be explained. First, as the material of a piezoelectric element 11, the piezoelectric ceramic that is mainly formed of PZT ($PbZrO_3$ $PbTiO_3$) is used. This ceramics powder is mixed with solvent, dispersant, binder and plasticizer or the like and this mixed material is then extended to a uniform plane in the constant thickness using a blade or the like and is then further extended in the thickness of 20 to 100 $\mu$m, for example. The solvent is vaporized for the drying purpose and thereby a flexible sheet called a green sheet can be obtained.

Next, a pasted electrode material, for example, the electrode material in which platinum (Pt)-based or silver-palladium (Ag—Pd) based electrode material is pasted with an adequate resin binder is printed (after the normalizing process, the resin binder is vaporized to become about 1 to 3 $\mu$m) in the thickness of about 3 to 7 $\mu$m with the means such as screen printing or the like to the front and rear surfaces of the green sheet (piezoelectric element) to form the first electrode 12 and the second electrode 13 and these electrodes are cut in the predetermined sizes.

Figure 3:
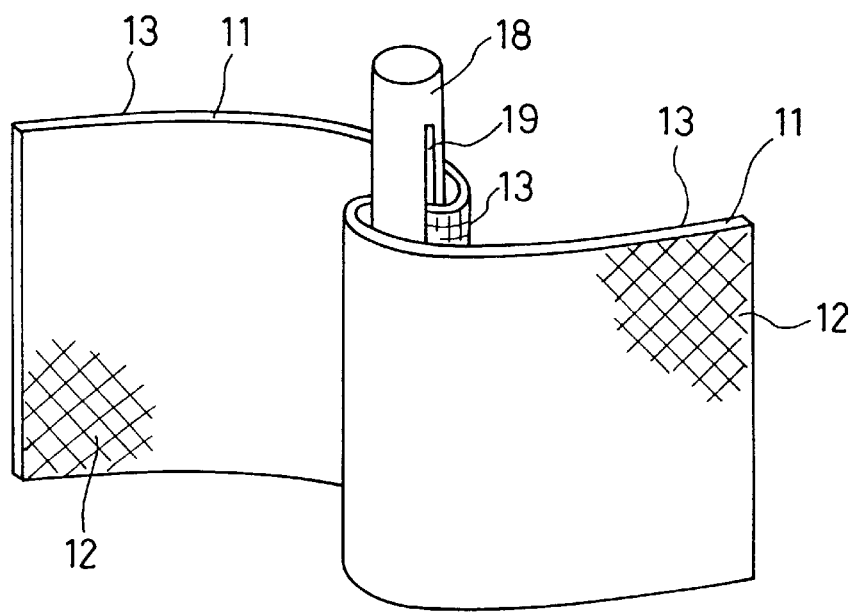
FIG. 3 is a diagram for explaining a profile of winding a piezoelectric transducer of the first embodiment into a cylindrical shape using a winding shaft.

Next, as illustrated in FIG. 3, a winding shaft 18 on which a slit 19 is formed in the longitudinal direction is prepared, the coupling part 14 at the center of the piezoelectric element sheet 11 forming respectively the first and second electrodes 12, 13 at the front and rear surfaces is engaged with the slit of winding shaft 18 and this sheet is wound into the cylindrical shape so that the piezoelectric element sheet is laminated with each other.

When the winding shaft 18 is removed from the wound cylindrical body, a couple of cavities 12a, 13a partitioned with the coupling part 14 are formed at the internal side of the cylindrical material. Namely, since the cavity 12a exposing the first electrode 12 is formed at the one surface of coupling part 14 and the surface opposing thereto, while the cavity 13a exposing the second electrode 13 is formed to the other surface of the coupling part 14 and the surface opposing thereto, these cavities exposing these electrodes can be used as the junction part of the power feeding terminals. Structures of these power-feeding terminals will be explained later.

Figure 4:
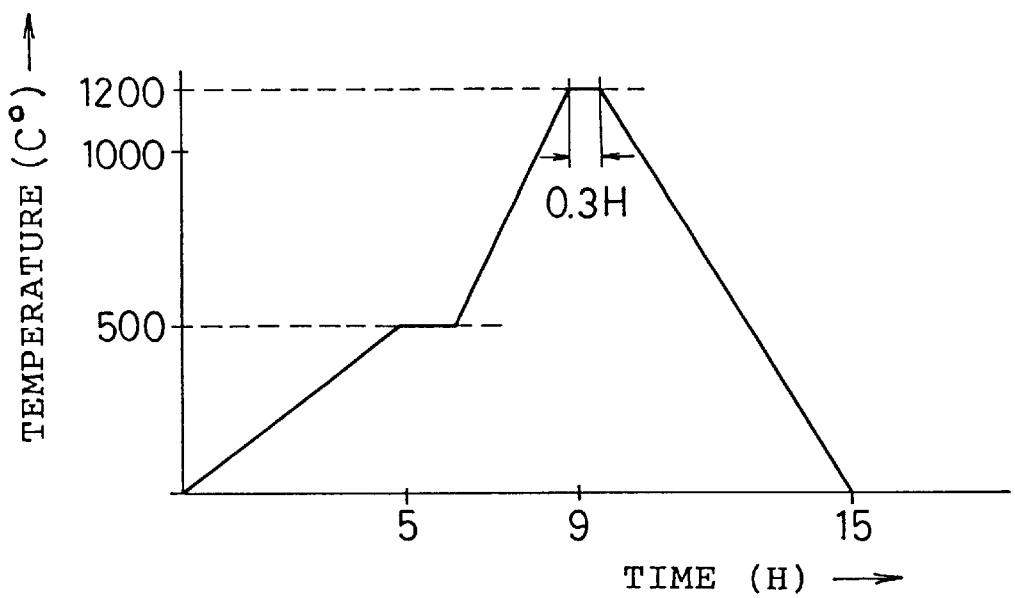
FIG. 4 is a diagram illustrating an example of the baking temperature condition of a piezoelectric transducer.

Next, the cylindrically wound and laminated material is normalized under the predetermined temperature condition. As the normalizing temperature condition, for example, as illustrated in FIG. 4, temperature is gradually raised up to 500° C. for the constant period. Thereafter, temperature is then raised gradually up to 1200° C. after nine (9) hours from the beginning. Moreover, normalizing is executed for about 0.3 hour at 1200° C. and thereafter temperature is then fallen up to the normal temperature during six (6) hours.

The polarizing direction is set to the thickness direction of the piezoelectric element and a voltage of 1.5 kV/mm is applied for 20 minutes across the electrodes 12 and 13, for example, under the environment of 60° C. for the polarization purpose. When the piezoelectric element is polarized, displacement can be generated in the cylinder axis direction in the piezoelectric transducer 10.

Next, a method of connecting a lead-wire with the cavities formed at the center of the cylindrical material as the junction part of the power-feeding terminal will be explained. In the first lead-wire connection method, a lead-wire is soldered to the electrode exposed in the cavities or joined thereto with a conductive paste.

Figure 5:
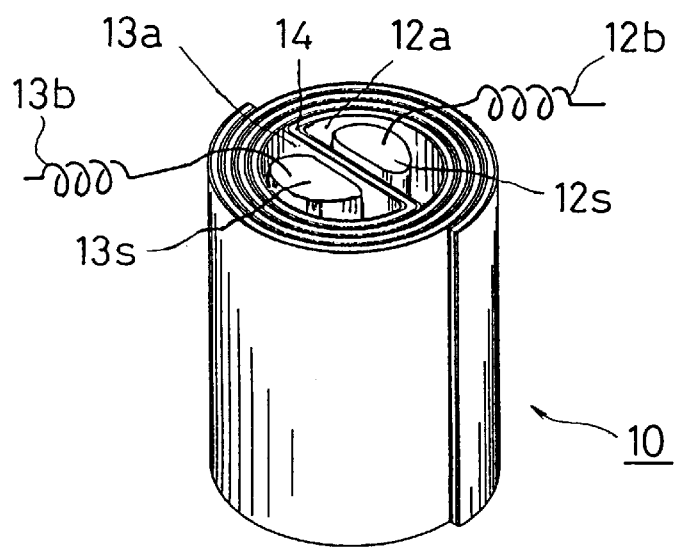
FIG. 5 is a diagram for explaining a first example of lead wire connection method to the piezoelectric transducer illustrated in FIG. 1.

FIG. 5 illustrates an example of such junction method. The lead-wires 12b, 13b are joined to the first electrode 12 exposed to the cavity 12a and to the second electrode 13 exposed to the cavity 13a using solder or conductive paste. For example, after the lead-wires 12b, 13b are inserted to the cavities 12a, 13a and these cavities are then filled with solder or conductive paste 12s, 13s for the joint of lead-wires.

In general, the solder joint can be realized with the chemical joint including fusion or the like between both metals and the mechanical joint wherein solder enters the fine projected and recessed areas at the joint surface. Meanwhile, in manufacture of a piezoelectric transducer, since the normalization under the higher temperature is performed as explained above, the electrode material such as platinum (Pt)-based or silver-Palladium (Ag—Pd)-based material having the higher melting point is used as the electrode material.

Since chemical joint property between the electrode material having higher melting point and solder is rather bad, an accident such as disconnection of lead wire due to bad joint property is easily generated, although the solder joint of electrode and lead-wire is mainly based on the mechanical joint. However, since the cavities are filled with the solder to obtain the wider joint area, the lead-wire can be joined rigidly.

In the second lead-wire connection method, a contactor that is formed of an elastic metal is inserted into the cavities and it is then placed in contact with the exposed electrode for the joining purpose.

Figure 6:
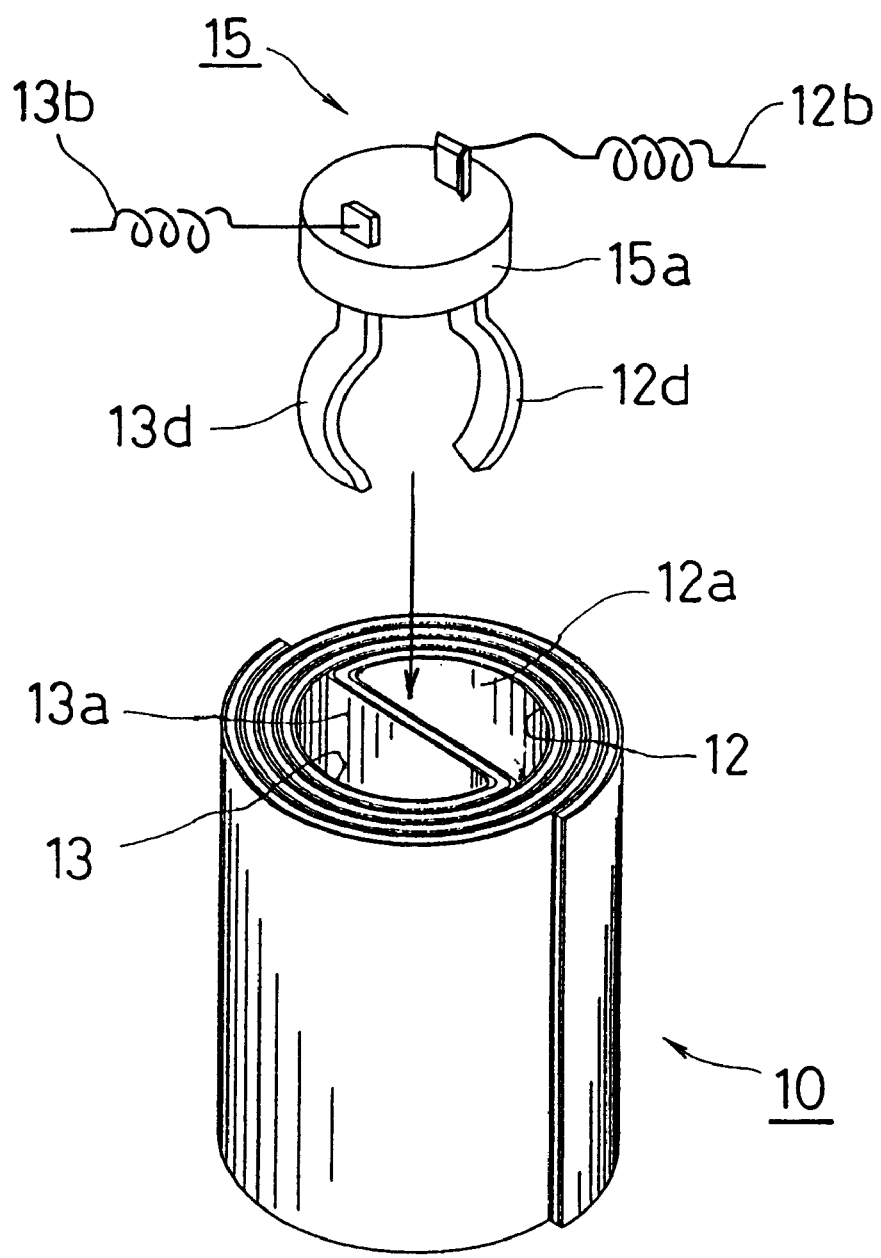
FIG. 6 is a diagram for explaining a second example of lead wire connection method to the piezoelectric transducer illustrated in FIG. 1.

FIG. 6 illustrates an example of above method. In this method, the power-feeding terminal 15 is prepared, in which a non-conductive (electrically insulated) holding member 15a is provided with contactors 12d, 13d formed of elastic metal material. The lead-wires 12b, 13b are joined to the contactors 12d, 13d.

Next, when the holding member 15a is inserted into the cylindrical material in such a manner that the contactor 12d is in contact with the first electrode 12 exposed in the cavity 12a and the contact 13d is in contact with the second electrode 13 exposed in the cavity 13a, the first electrode 12 and second electrode 13 can be connected with the lead-wires 12b, 13b via the contactor 12d, 13d.

The holding member 15a is assumed to use electrical insulation material such as polycarbonate, ABS resin and ceramics, while the contactors 12d, 13d are assumed to use an elastic material such as the copper-plated copper-based material or copper-plated iron-based material. The shape of contactor explained above is only an example and it is also possible to provide the projection at the contact part with the electrode and the cutout portion thereto in order to control the spring property.

In the third lead-wire connection method, the power-feeding terminal formed of a conductive resin having elasticity and conductive rubber is inserted into the cavities and it is then placed in contact with the exposed electrode for the joint.

Figure 7:
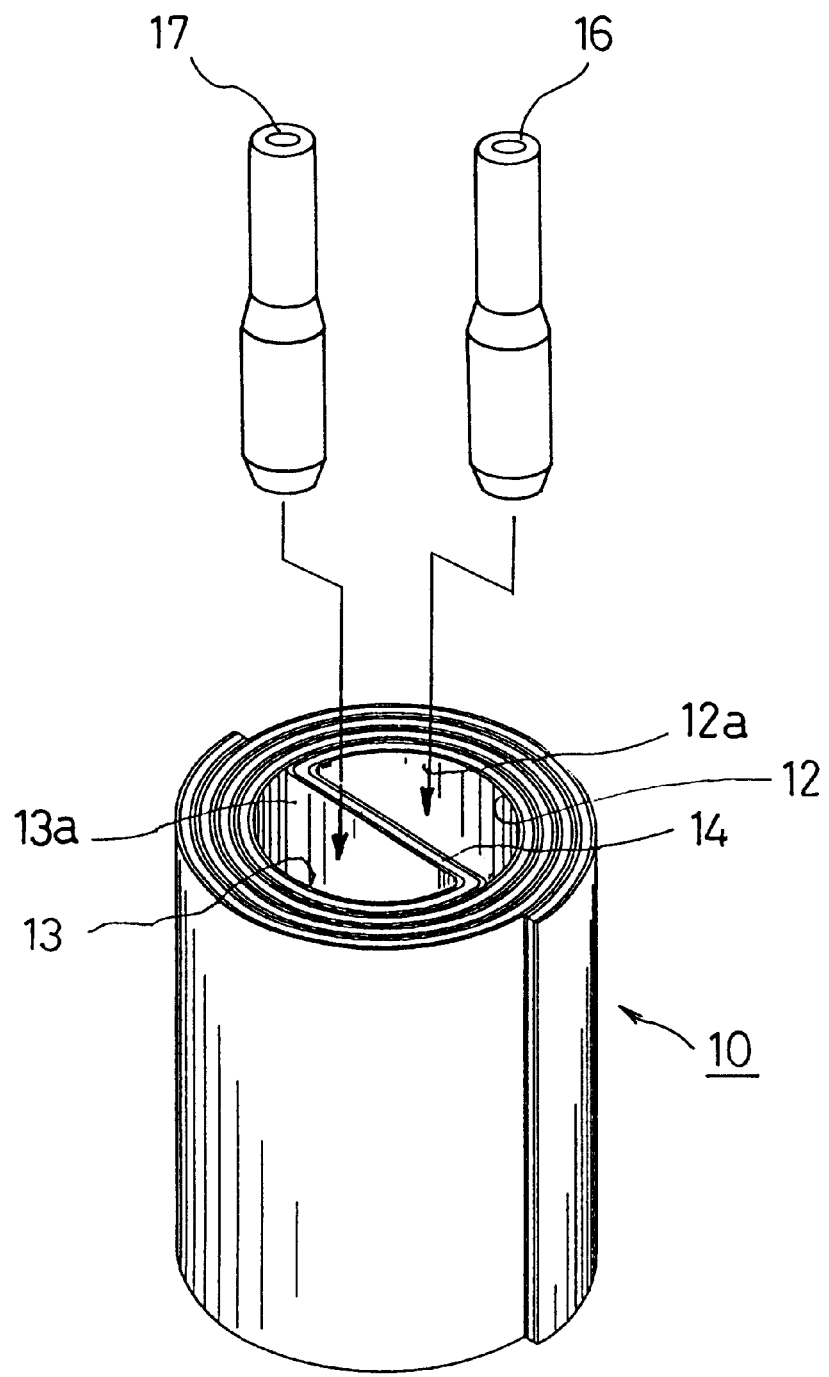
FIG. 7 is a diagram for explaining a third example of lead wire connection method to the piezoelectric transducer illustrated in FIG. 1.

FIG. 7 illustrates an example of such joint. Numerals 16, 17 designate power-feeding terminals formed of conductive resin having elasticity including metal filler and conductive rubber. A part of the power-feeding terminal (lower half in FIG. 7) is formed in the diameter larger than the maximum internal diameter of the cavities 12a, 13a of the piezoelectric transducer 10 and the upper end thereof is connected to the lead-wire with the adequate means.

When the power-feeding terminals 16, 17 are inserted to the cavities 12a, 13a of the piezoelectric transducer 10, the power-feeding terminals 16, 17 are elastically deformed and in contact with the first electrode 12 and second electrode 13 at the internal side of the cavities 12a, 13a to connect the first electrode 12 and second electrode 13 to the lead-wires.

The power-feeding terminal is also provided with the cutout portion or hole to make large the elastically deforming area or with the projection in order to improve contact property for the electrode.

[Second Embodiment]

The piezoelectric transducer of the second embodiment is formed by laminating a first piezoelectric element having formed the first electrode at the surface and a second piezoelectric element having formed the second electrode at the surface and the winding these elements with the electrode forming surfaces placed at the internal side into the cylindrical shape.

Figure 8:
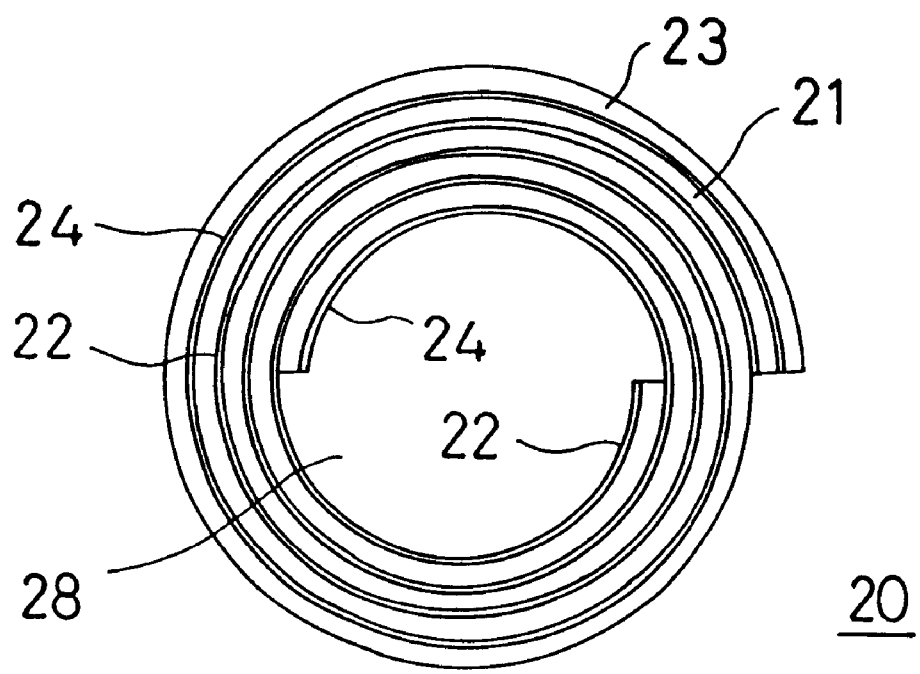
FIG. 8 is a cross-sectional view illustrating a structure of the piezoelectric transducer of the second embodiment.

FIG. 8 is a cross-sectional view illustrating the structure of the piezoelectric transducer 20 of the second embodiment. In the figure, thickness of the piezoelectric element and electrode is illustrated as the expanded image. The first piezoelectric element 21 where the first electrode 22 is formed on the surface of sheet formed of the piezoelectric ceramics-based piezoelectric material and the rear surface is formed as the electrode non-forming surface and the second piezoelectric element 23 where the second electrode 24 is formed at the surface of the sheet and the rear surface is formed as the electrode non-forming surface are manufactured.

Next, these first and second piezoelectric elements 21, 23 are laminated in such a manner that the electrode non-forming surface of the first piezoelectric element 21 is provided opposed to the second electrode 24 of the second piezoelectric element 23, this laminated material is wound, with the first electrode 22 forming surface of the first piezoelectric element 21 and the second electrode 24 forming surface of the second piezoelectric element 23 located at the internal side, into the cylindrical shape where the cavity 28 is formed at the center area.

When the first and second piezoelectric elements are laminated, the end part of the first piezoelectric element 21 and the end part of the second piezoelectric element 23 are deviated, as illustrated in FIG. 8, almost by 180 degrees at the internal surface of cylindrical shape at the time of forming the cylindrical shape. Such deviation is necessary to prevent simultaneous contact of the contactors of power-feeding terminals with both electrodes.

Manufacture of material of piezoelectric element and green sheet, formation of electrode material and electrode normalization and polarization of the wound cylindrical material are the same as those of the first embodiment explained previously and the same explanation is omitted herein. The piezoelectric transducer 20 may be completed through the processes explained above.

Next, a method of connecting the cavity formed at the center of cylindrical material to the lead-wire as the joint part of the power-feeding terminal will be explained.

In the first lead-wire connection method, the power-feeding terminal having the contactor formed of elastic metal piece is inserted to the cavity and is joined through contact with the exposed electrode.

Figure 9:
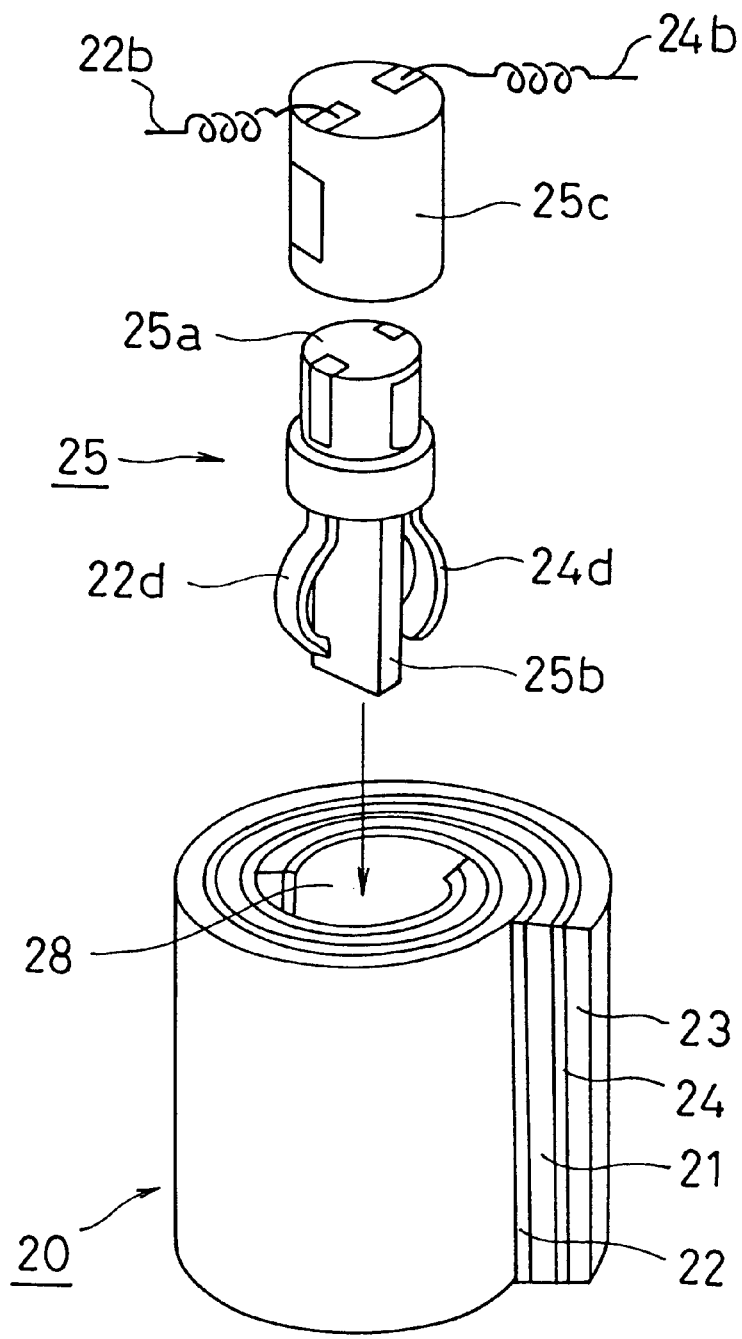
FIG. 9 is a diagram for explaining the first example of lead wire connection method to the piezoelectric transducer illustrated in FIG. 8.

FIG. 9 illustrates a first example. First, the power-feeding terminal 25 where the holding member 25a having electrical insulation property is provided with the contactors 22d, 24d formed of elastic material is prepared. The holding member 25a is preferably provided with an insulation plate 25b between a pair of contactors 22d, 24d in order to prevent contact accident of contactors. The insulation plate 25b can also be used for positioning in the radius direction of the cylindrical material and power-feeding terminal 25.

The contactors 22d, 24d may be joined with the lead-wires 22b, 24b directly and moreover may be joined indirectly with the lead-wires 22b, 24b via an electrical insulation cap 25c as illustrated in FIG. 9.

When the holding member 25a having the contactors 22d, 24d is inserted into the cavity 28 of the cylindrical piezoelectric transducer 20 and the contactor 22d is placed in contact with the first electrode 22 exposed in the cavity 28, while the contactor 24d with the second electrode 24 is exposed in the cavity 28, the first and second electrodes 22, 24 are connected to the lead-wires 22b, 24b via the contactors 22d, 24d.

In the second lead-wire connection method, the cylindrical power-feeding terminal formed of elastic conductive resin or conductive rubber is inserted into the cavity and is joined with the electrode exposed in the cavity through the contact.

Figure 10:
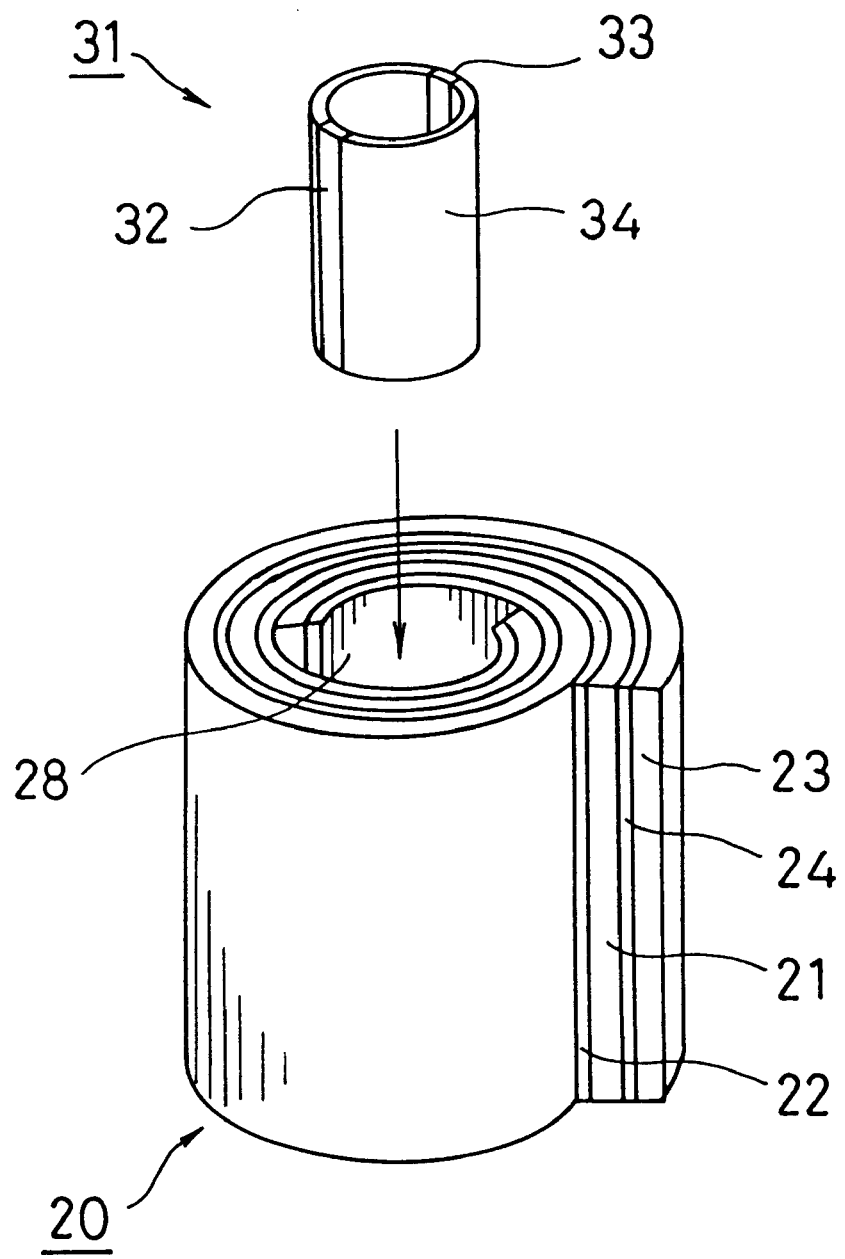
FIG. 10 is a diagram for explaining the second example of lead wire connection method to the piezoelectric transducer illustrated in FIG. 8.

FIG. 10 illustrates an example of this structure. The power-feeding terminal 31 is formed in the cylindrical shape by the extrusion molding together with contactors 32 and 33 formed of elastic and conductive resin including metal filler and conductive rubber and the insulation member 34 formed of the material such as non-conductive resin and rubber. The diameter of power-feeding terminal 31 is set larger than the maximum internal diameter of the cavity 28 of the piezoelectric transducer 20, the contactors 32 and 33 are located at the position opposed in the radius direction by 180 degrees and the lead-wires are connected to the upper end of the contactors 32 and 33 with an adequate means.

Here, it is also possible in the power-feeding terminal that the conductive resin and conductive rubber part is formed of a metal foil and is integrally molded with the insulation member 34 consisting of material such as non-conductive resin and rubber.

When this power-feeding terminal 31 is inserted to the cavity 28 of the piezoelectric element 20, the power-feeding terminal 31 is elastically deformed causing the contactors 32 and 33 to connect with the first electrode 22 and second electrode 24 at the internal surface of the cavity 28. Thereby, the first electrode 22 and the second electrode 24 may be connected to the lead-wires.

Here, it is also possible to provide the structure that the power-feeding terminal is connected to the piezoelectric transducer by utilizing the fixing member for fixing the piezoelectric transducer. This structure will then be explained hereunder.

Figure 11:
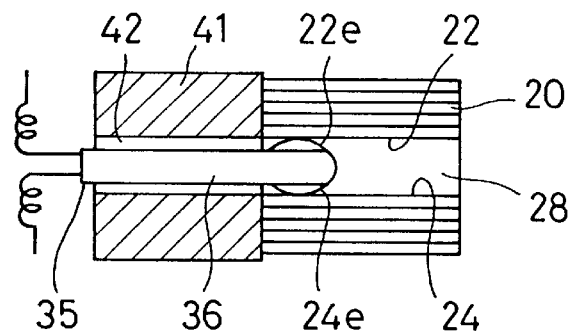
FIG. 11 is a diagram for explaining the first example of lead wire connection method to connect the power feeding terminals to the piezoelectric transducer by utilizing a fixing member for fixing the piezoelectric transducer.

FIG. 11 illustrates a first example of such structure. A hole 42 almost in the same diameter as the cavity 28 of the piezoelectric transducer 20 is provided at the center of the fixing member 41 and the piezoelectric transducer 20 is fixed. Meanwhile, in the power-feeding terminal 35, the contactors 22e, 24e that are almost in the same shape as the contactors 22d, 24d of the power-feeding terminal 31 illustrated in FIGS. 9 and 10 are attached to a column body 36 that is a little narrower than the hole 42 of the fixing member 41 and the lead-wire is extended from the opposite side of the column body (from the side far from the piezoelectric transducer).

The hole 42 of the fixing member 41 and the cavity 28 of the piezoelectric transducer 20 are arranged coaxially, the piezoelectric transducer 20 is fixed to the fixing member 41 with a method such as bonding or the like, the power-feeding terminal 35 is inserted into the hole 42, the first electrode 22 and second electrode 24 exposed in the cavity of the piezoelectric transducer 20 are placed in contact with the contactors 22i eand 24e of the power-feeding terminal 35, and the first electrode 22 and second electrode 24 are connected with the lead-wires 22b, 24b. As the fixing member 41, any one of the conductive materials such as metal or non-conductive material may be used.

According to this method, since the lead-wire can be connected to the piezoelectric transducer 20 can be connected only by inserting the power-feeding terminal 35, the productivity can be enhanced more than that when the soldering is conducted.

Figure 12:
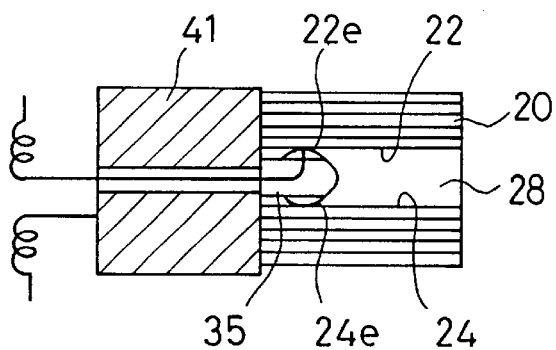
FIG. 12 is a diagram for explaining the second example of lead wire connection method to connect the power feeding terminals to the piezoelectric transducer by utilizing a fixing member for fixing the piezoelectric transducer.

FIG. 12 illustrates an example of such second example. In this example, the power-feeding terminal 35 mounting the contactors 22e and 24e is provided to the fixing member 41, the cavity 28 of the piezoelectric transducer 20 is inserted into the power-feeding terminal 35 to place the first electrode 22 and second electrode 24 exposed in the cavity of the piezoelectric transducer 20 in contact with the contactors 22e and 24e of the power-feeding terminal 35 and the piezoelectric transducer 20 is fixed to the fixing member 41 with a method such as the bonding or the like. The fixing member 41 is formed of a conductive material such as metal and one of the contactors is fixed in direct contact with the fixing member 41 and only the other contactor is insulated. Thereby, the wiring structure can be simplified when the fixing material 41 is provided through the structure.

Figure 13:
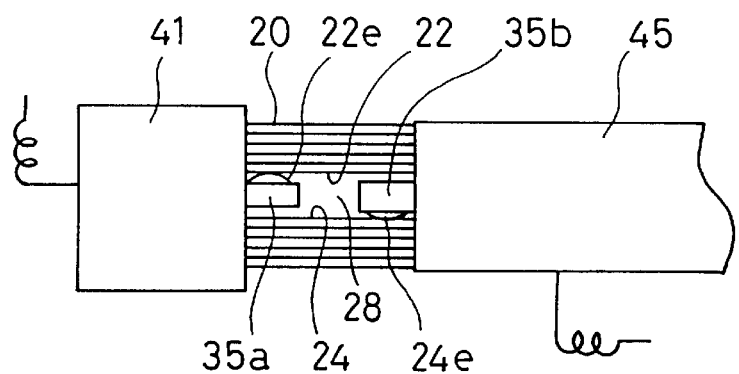
FIG. 13 is a diagram for explaining an example of lead wire connection method to connect the power feeding terminals to the piezoelectric transducer by utilizing a fixing member for fixing the piezoelectric transducer and a drive shaft.

FIG. 13 illustrates a third example. In this example, the fixing member 41 is provided with the power-feeding terminal 35a mounting the contactor 22e and the drive shaft 45 is provided with the power-feeding terminal mounting the contactor 24e. The cavity 28 of the piezoelectric transducer 20 is inserted to the power-feeding terminal 35a in the fixing member 41 side to place the first electrode exposed in the cavity 28 in contact with the contactor 22e of the power-feeding terminal 35a and to fix one end part of the piezoelectric transducer 20 to the fixing member 41 with a method such as bonding or the like.

Moreover, the contactor 24e of the power-feeding terminal 35b provided to the drive shaft is inserted from the opposite side of the piezoelectric transducer 20 to place the second electrode 24 exposed in the cavity 28 in contact with the contactor 24e of the power-feeding terminal 35b and fix the end part of the piezoelectric transducer 20 to the drive shaft 35 with a method such as bonding or the like.

According to this method, the electrical power may be fed to first and second electrodes by utilizing the fixing member 41 and drive shaft 45 and thereby the wiring structure may be simplified.

[Structure of Actuator]

Next, structure of an actuator utilizing the piezoelectric transducer will be explained with reference to FIG. 14 and FIG. 15. The actuator using the piezoelectric transducer 20 of the second embodiment illustrated in FIG. 11 will be explained as an example but following explanation will be also true for the use of the piezoelectric transducer 10 of the first embodiment.

Figure 14:
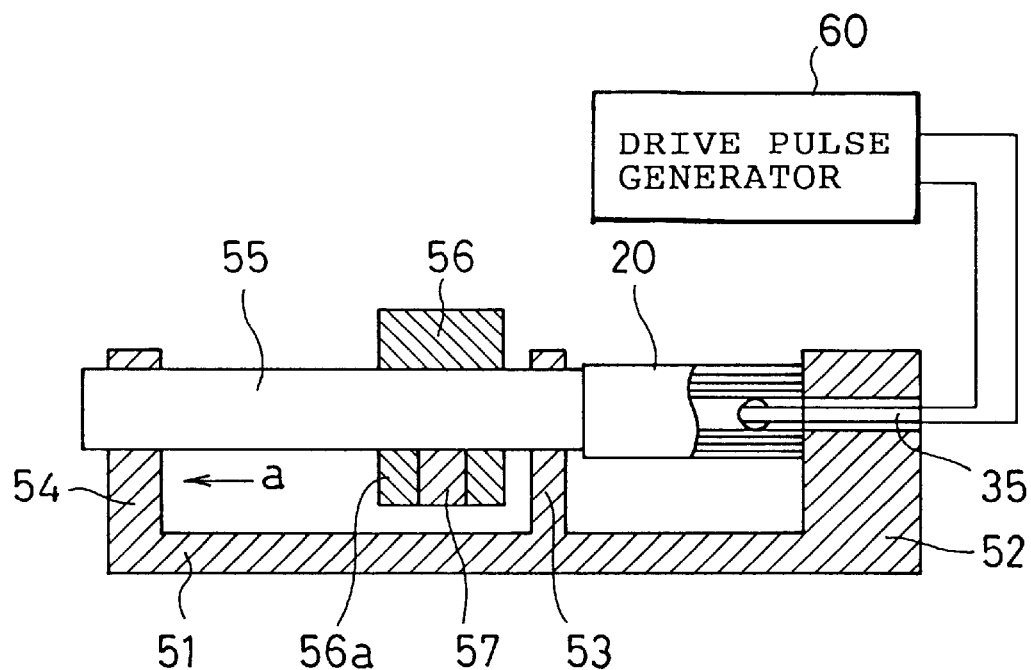
FIG. 14 is a cross-sectional view illustrating a structure of an actuator utilizing a piezoelectric transducer.
Figure 15:
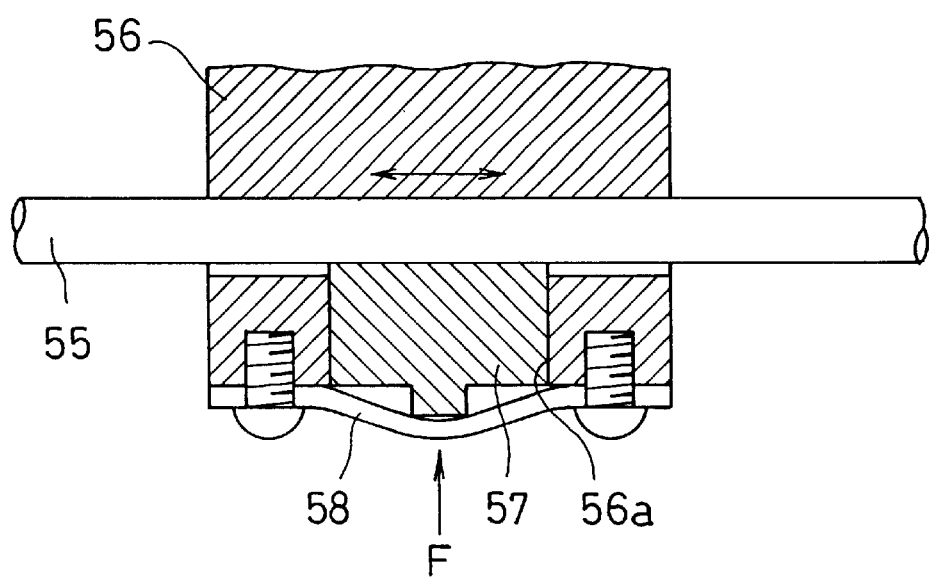
FIG. 15 is a cross-sectional view illustrating a structure of a friction coupling part between a slider and a drive shaft of the actuator.
Figure 16:
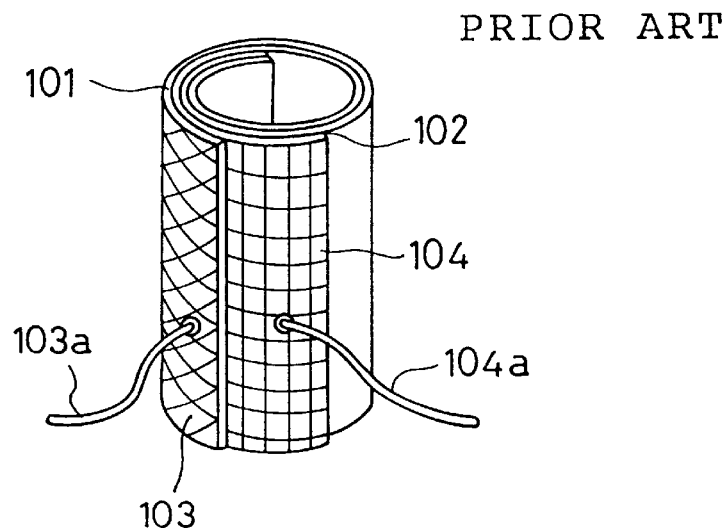
FIG. 16 is a perspective view illustrating an example of the piezoelectric transducer of the related art that is formed in the cylindrical shape by laminating two sheets of thin plate type piezoelectric elements.
Figure 17A:
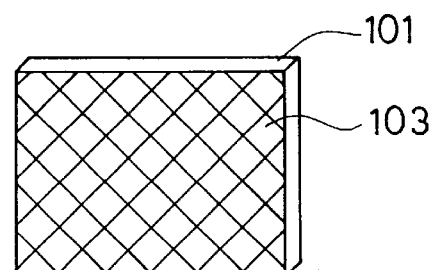
FIGS. 17(a) and 17(b) are diagrams for explaining the electrode forming surface and laminating condition of the piezoelectric transducer of the related art illustrated in FIG. 16.
Figure 17B:
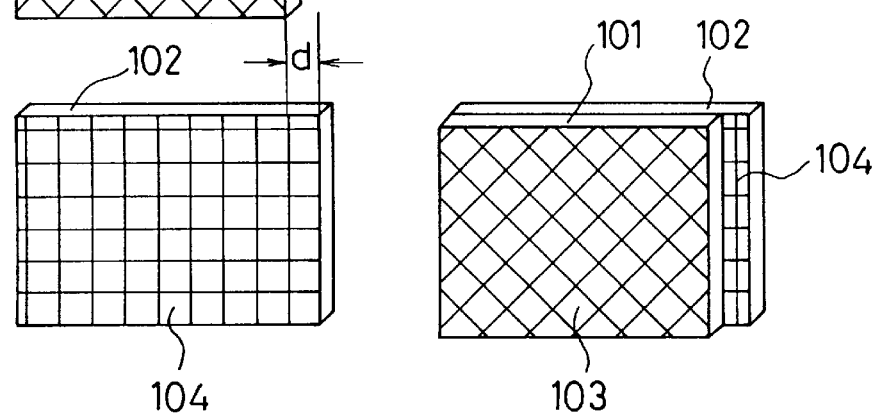
Figure 18:
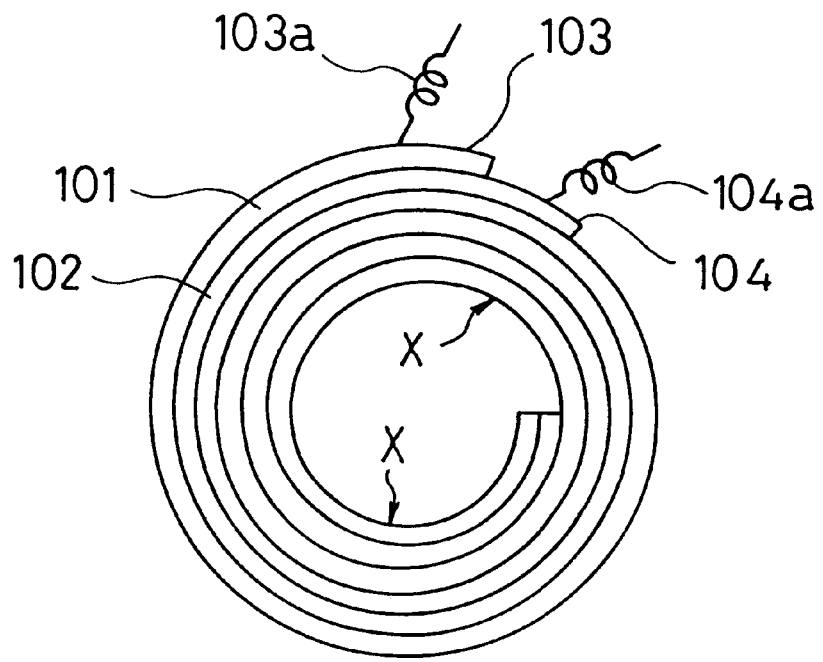
FIG. 18 is a plan view for explaining the end face in the shaft direction of cylindrical shape of the piezoelectric transducer of the related art illustrated in FIG. 16.

FIG. 14 is a cross-sectional view illustrating a structure of an actuator. In FIG. 14, the numeral 51 designates a baseboard; 52, 53, 54, supporting block; 55, a drive shaft. The drive shaft 55 is supported with the supporting blocks 53, 54 to displace in the axis direction (direction of arrow mark a and direction opposed to such direction) depending on displacement in the axial direction generated in the piezoelectric transducer 20.

One end of the piezoelectric transducer 20 is fixed by bonding to the supporting block 52, while the other end is fixed by bonding to one end of the drive shaft 55. The power-feeding terminal 31 (refer to FIG. 11) is inserted to the cavity formed at the center of the piezoelectric transducer 20 and thereby a drive pulse generator 60 supplies a saw-tooth wave pulse including the gradually rising part and sharp falling part or sharp rising part and gradually falling part.

Numeral 56 designates a slider and the slider 56 and the drive shaft 55 are coupled through friction with an adequate friction force. FIG. 15 is a cross-sectional view illustrating a structure of the friction-coupling part between the slider 56 and drive shaft 55. The drive shaft 55 is provided through the slider 56, an aperture 56a is formed at the lower part of the slider 56 through which the drive shaft 55 is provided and the lower half of the drive shaft 55 is exposed. Moreover, the aperture 56a is engaged with a pad 57 that is placed with pressure in contact with the lower half of the drive shaft 55, the pad 57 is pushed upward with a plate spring 58, the drive shaft 55, slider 56 and pad 57 are pressured in contact with each other with an energizing force F of the plate spring 58 and these are friction-coupled with an adequate friction force. Moreover, it is also assumed that the slider 56 is coupled with a member to be driven such as a table or the like not illustrated.

Operations of the slider will be explained. When the first electrode 22 and second electrode 24 of the piezoelectric transducer 20 are connected to the drive pulse generator 60 and the saw-tooth wave drive pulse of several 10 kHz is applied across the first electrode 22 and second electrode 24, elongation/contraction displacement is generated in the axial direction of the piezoelectric transducer 20. Therefore, reciprocal vibrations are generated in different velocity in the axial direction of the drive shaft 55 coupled with the piezoelectric transducer 20. Thereby, the slider 56 that is friction-coupled with the drive shaft 55 slides on the drive shaft 55 to move in the direction of lower velocity vibration due to asymmetrical property of reciprocal vibration of the drive shaft. Thereby, the member to be driven such as a table or the like coupled with the slider can be moved.

In the embodiment explained above, power is fed to the positive and negative electrodes utilizing the cavity formed at the center of the piezoelectric transducer formed in the cylindrical shape, but it is also possible to feed the power only to anyone electrode of the positive and negative polarities utilizing the cavity and to feed the power to the other electrode from the side surface of the piezoelectric transducer.

In addition, in the case where the electrodes are formed on the green sheet with a method such as printing, it is also possible that one electrode is exposed to the end surface of the green sheet through the masking, the other electrode is never exposed to the end surface with formation of electrode by the printing method, the power is fed to the electrode exposed on the end surface from the end surface and the power is also fed to the electrode not exposed at the end surface utilizing the cavity formed at the center.

As explained above, the piezoelectric transducer used for the actuator of the present invention is formed in the cylindrical shape. In this case, the electrodes are exposed at the internal surface of the cylindrical shape and the electrical power is fed to the electrodes from the internal surface of the cylindrical shape. Therefore, the external size of the piezoelectric transducer can be reduced in comparison with the transducer of the related art wherein the lead-wire is soldered to the electrodes exposed at the external surface of the cylindrical shape.

Since the power-feeding terminal is inserted in the internal surface of the cylindrical shape as the wiring for the power feeding to the electrode, the assembling process may be simplified and thereby the working efficiency can be extremely improved.

Moreover, with this structure, the actuator may be reduced in size even when the piezoelectric transducer is comprised in the actuator, and thereby this structure makes much contribution to reduction in size of the apparatus using the actuator explained above.

Although the present invention has bee fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. An actuator comprising:
   a piezoelectric transducer that is formed by winding up at least one sheet type piezoelectric element and a plurality of electrodes into a cylindrical shape; and
   a power-feeding terminal for applying voltage to said plurality of electrodes, said power-feeding terminal being in contact with said plurality of electrodes at a core of the cylindrical shape of said piezoelectric transducer.

2. An actuator comprising:
   a piezoelectric transducer that is formed by winding up at least one sheet type piezoelectric element and a plurality of electrodes into a cylindrical shape; and
   a power-feeding terminal for applying voltage to said plurality of electrodes, said power-feeding terminal being in contact with said plurality of electrodes at a core of the cylindrical shape of said piezoelectric transducer,
   wherein said plurality of electrodes are arranged on both front and rear surfaces of said at least one sheet type piezoelectric element.

3. An actuator as claimed in claim 1, wherein said piezoelectric transducer is formed by layering sheet type piezoelectric elements and said plurality of electrodes in a stack and rolling up said stack into the cylindrical shape.

4. An actuator comprising:
   a piezoelectric transducer that is formed by winding up at least one sheet type piezoelectric element and a plurality of electrodes into a cylindrical shape; and
   a power-feeding terminal for applying voltage to said plurality of electrodes, said power-feeding terminal being in contact with said plurality of electrodes at a core of the cylindrical shape of said piezoelectric transducer,
   wherein said power-feeding terminal includes a contactor formed of a metal material having elasticity.

5. An actuator as claimed in claim 4, wherein said power-feeding terminal further includes a non-conductive holding member which holds said contactor.

6. An actuator as claimed in claim 1, wherein said power-feeding terminal includes a conductive part which is in contact with said plurality of electrodes and is formed of conductive resin or conductive rubber.

7. An actuator comprising:
   a piezoelectric transducer that is formed by winding up at least one sheet type piezoelectric element and a plurality of electrodes into a cylindrical shape; and
   a power-feeding terminal for applying voltage to said plurality of electrodes, said power-feeding terminal being in contact with said plurality of electrodes at a core of the cylindrical shape of said piezoelectric transducer, and wherein said power-feeding terminal further includes a non-conductive holding member which holds said conductive part.

8. An actuator comprising:

a piezoelectric transducer that is formed by winding up at least one sheet type piezoelectric element and a plurality of electrodes into a cylindrical shape; and a power-feeding terminal for applying voltage to said plurality of electrodes, said power-feeding terminal being in contact with said plurality of electrodes at a core of the cylindrical shape of said piezoelectric transducer, wherein said power-feeding terminal includes a plurality of lead-wires, each of which is soldered to one of said plurality of electrodes.

9. An actuator comprising:

a piezoelectric transducer that is formed by winding up at least one sheet type piezoelectric element and a plurality of electrodes into a cylindrical shape; and a power-feeding terminal for applying voltage to said plurality of electrodes, said power-feeding terminal being in contact with said plurality of electrodes at a core of the cylindrical shape of said piezoelectric transducer, wherein said plurality of electrodes are each exposed at an inner space of the cylindrical shape.

* * * * *